US012709368B2

(12) United States Patent
Arias-Thode et al.

(10) Patent No.: US 12,709,368 B2
(45) Date of Patent: Aug. 18, 2026

(54) DATA POD RELEASE SYSTEM

(71) Applicant: Naval Information Warfare Center Pacific, San Diego, CA (US)

(72) Inventors: Y. Meriah Arias-Thode, San Diego, CA (US); Eric G. Bozeman, La Mesa, CA (US); Angelica Velasquez Sarmiento, San Diego, CA (US); Alexander Stevens-Bracy, Chula Vista, CA (US); Matthew L. Bond, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 487 days.

(21) Appl. No.: 18/446,783

(22) Filed: Aug. 9, 2023

(65) Prior Publication Data

US 2024/0326966 A1 Oct. 3, 2024

Related U.S. Application Data

(60) Provisional application No. 63/492,507, filed on Mar. 28, 2023.

(51) Int. Cl.
*G01V 1/38* (2006.01)
*B63C 11/52* (2006.01)
(Continued)

(52) U.S. Cl.
CPC ............... *B63C 11/52* (2013.01); *H01M 8/16* (2013.01); *H05K 5/065* (2013.01)

(58) Field of Classification Search
CPC .......... B63B 35/00; B63B 1/30; B63B 22/00; B63B 22/003; B63B 2207/02;
(Continued)

(56) References Cited

U.S. PATENT DOCUMENTS 3,141,148 A * 7/1964 Hueter ................. G10K 11/008 367/173
3,293,676 A * 12/1966 Link ....................... B63B 22/24 367/133

(Continued)

OTHER PUBLICATIONS

Unpublished U.S. Appl. No. 17/824,799 with common inventors.
Unpublished U.S. Appl. No. 63/484,107 with common inventors.

*Primary Examiner* — Edwin J Toledo-Duran
(74) *Attorney, Agent, or Firm* — Naval Information Warfare Center Pacific; Matthew D. Pangallo; Kyle Eppele

(57) ABSTRACT

A data pod release system includes a base frame with a mooring weight, a central column with one or more central pod attachments and an electronic pod, one or more data pod attachments, and one or more electrical connections. The electronic pod encases a master electronic underwater housing unit with master electronics to control the data pod release system. The one or more data pod attachments attach one or more data pods to the central column, have a data pod release mechanism, and include electrical connections from master electronics to each data pod attachment. The data pod release system also includes data pods, underwater housing units, electronic storage devices, and sensors. The data pods are attached to the base frame via the data pod attachment. Each underwater housing unit is encased in the data pod. Each electronic storage device is enclosed within the underwater housing unit.

14 Claims, 7 Drawing Sheets

(51) Int. Cl.
*H01M 8/16* (2006.01)
*H05K 5/06* (2006.01)

(58) Field of Classification Search
CPC ... B63B 22/18; B63B 2022/006; E21B 25/18; E21B 25/16; E21B 49/001; E21B 15/02; G01N 3/30; G01N 11/12; G01N 3/42; G01N 1/12; G01N 33/24; G01N 11/14; G01N 2001/1031; G01N 2203/0032; G01S 1/70; E02D 1/025; E02D 1/04; G01V 9/00; G01V 1/38; G01L 7/00; A47B 91/02; F16M 7/00; H04B 11/00; H04B 13/02; B63C 11/52; H01M 8/16; H05K 5/065
See application file for complete search history.

(56) References Cited

U.S. PATENT DOCUMENTS 3,316,531 A * 4/1967 Baker .................... B63B 22/06 367/133
3,369,368 A * 2/1968 Wilson .................... B63C 11/36 114/333
3,550,388 A * 12/1970 Wilmer .................. B63B 21/50 405/188
3,593,533 A * 7/1971 Washington ............ E02F 7/005 37/313
3,766,742 A * 10/1973 Smith .................... B63C 11/40 405/188
4,058,945 A * 11/1977 Knapp ..................... E04B 1/32 D25/4
4,109,601 A * 8/1978 Ronnevig ............... B63C 11/40 405/188
4,123,858 A * 11/1978 Batchelder ............ E02F 3/9225 37/313
4,141,295 A * 2/1979 Campbell ................ B63G 7/00 102/407
4,164,195 A * 8/1979 Frigeni ................... B63C 11/42 114/322
4,692,906 A * 9/1987 Neeley ..................... G01V 1/38 367/15
4,780,863 A * 10/1988 Schoepf .................. B63C 11/52 367/15
5,066,256 A * 11/1991 Ward, Sr. ................ B63B 22/08 114/328
5,189,642 A * 2/1993 Donoho ................... G01V 1/24 367/15
6,068,427 A * 5/2000 Ostergaard ............ E21B 33/035 405/188
6,371,003 B1 * 4/2002 Hickey ..................... F41F 3/10 102/411
6,402,031 B1 * 6/2002 Hall ........................ G05B 19/00 235/400
6,625,083 B2 * 9/2003 Vandenbroucke ....... G01V 1/16 367/16
7,286,442 B2 * 10/2007 Ray .......................... G01V 1/18 346/33 C
7,646,670 B2 * 1/2010 Maxwell .................. G01V 1/38 367/15
7,965,583 B2 * 6/2011 Thomas ............... G01V 1/3852 367/19
8,408,956 B1 * 4/2013 Vosburgh ................ B63B 22/18 441/6
9,030,919 B2 * 5/2015 You .......................... G01V 1/18 367/181
9,651,374 B1 * 5/2017 Wingo .................... B63B 22/06
10,539,696 B2 * 1/2020 Ray ...................... G01V 1/3852
11,525,932 B2 * 12/2022 Rokkan .................. G01V 1/166
2002/0153419 A1 * 10/2002 Hall ...................... G06F 1/1635 235/400
2004/0000912 A1 * 1/2004 Conti ....................... G01V 3/15 324/365
2005/0213649 A1 * 9/2005 Green ..................... B63B 22/06 375/222
2005/0270901 A1 * 12/2005 Swanson .................. G01V 1/38 367/15
2006/0226842 A1 * 10/2006 Conti ..................... G01V 3/083 324/353
2006/0294026 A1 * 12/2006 Schellingerhout ...... G06F 21/10 705/80
2011/0144930 A1 * 6/2011 Bruno ..................... G01S 3/801 702/56
2013/0222115 A1 * 8/2013 Davoodi .................. H04Q 9/00 340/10.1
2014/0078861 A1 * 3/2014 Tamanaja ............. G01V 1/3852 367/16
2014/0211589 A1 * 7/2014 Maxwell .................. G01V 1/18 367/149
2015/0276959 A1 * 10/2015 Grimsdale ............... B63G 8/08 701/21
2017/0207658 A1 * 7/2017 Bana ....................... H02J 50/90
2018/0245417 A1 * 8/2018 Miller ................... E21B 19/008
2019/0016419 A1 * 1/2019 Sheldon-Coulson ... B63B 22/18
2019/0056473 A1 * 2/2019 Zalalutdinov ......... G01S 3/8034
2019/0368978 A1 * 12/2019 Sheryll ................... E21B 7/124
2020/0161715 A1 * 5/2020 Sarokhan ............ H01M 10/425
2020/0191900 A1 * 6/2020 Zalalutdinov ........... G01S 3/801
2020/0257009 A1 * 8/2020 Pei ......................... B63B 22/00
2020/0355590 A1 * 11/2020 Jia ........................... B63B 35/00
2021/0061458 A1 * 3/2021 Zeng ......................... B60F 5/02
2022/0206181 A1 * 6/2022 Santamarina ............ G01V 1/38
2023/0078347 A1 * 3/2023 Sheldon-Coulson ..... C25B 9/65 205/637

* cited by examiner

DATA POD RELEASE SYSTEM

CROSS-REFERENCE TO RELATED APPLICATION

This application claims the benefit of U.S. Provisional Application No. 63/492,507, filed Mar. 28, 2023, titled "Data Pod Release System", which the provisional application is hereby incorporated by reference in its entirety.

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor. Licensing and technical inquiries may be directed to the Office of Research and Technical Applications, Naval Information Warfare Center Pacific, Code 72120, San Diego, CA, 92152; (619) 553-5118; NIWC_Pacific_T2@us.navy.mil. Reference Navy Case Number 211463

BACKGROUND

Underwater sensor systems, such as a microbial fuel cell system, can be used to monitor underwater environments. In general, underwater sensor systems can be used to record data in a water body, such as an ocean. These sensors are typically replaced or recharged and redeployed to continue gathering data. Often, since underwater sensor systems have to be replaced, recharged, or redeployed, gaps in the data occur during that time. Some examples of underwater sensor systems include temperature sensors, oxygen sensors, chemical sensors, water sampling systems, sonar, and cameras.

DESCRIPTION OF THE DRAWINGS

Features and advantages of examples of the present disclosure will be apparent by reference to the following detailed description and drawings, in which like reference numerals correspond to similar, but in some instances, not identical, components. Reference numerals or features having a previously described function may or may not be described in connection with other drawings in which they appear.

DETAILED DESCRIPTION

Traditional underwater sensor systems, such as microbial fuel cell powered systems, have required different methods to recover data from the system. For example, a boat and diver may be needed to recover the system and retrieve the data. In order to extend the life of traditional systems, replacing the batteries and redeploying the system or replacing the entire system may be necessary. These systems are exposed to potential damage during recovery. In addition, using a diver and boat to recover the system, the data, or both is expensive. Recovering and redeploying a system or deploying a new system can disturb the environment being monitored as well as leave gaps or inconsistency in the data.

In the data pod release system herein, buoyant underwater housing units are enclosed in data pods and are periodically released individually to the surface of the water body based on a timer or triggered release installed in the system. Each underwater housing unit includes all the data collected up to the point of release by the data pod release system. This eliminates the need to recover the system, retrieve the data, and risk damaging the system during recovery. Therefore, the data pod release system herein is more efficient, less expensive, and lower risk compared to traditional systems that require recovery. Furthermore, since the system periodically releases underwater housing units to the surface of the water body, the life of the system can be extended without needing to recover and redeploy the system to retrieve the data. Periodic release of the buoyant underwater housing units also prevents any gaps in the data and leaves the environment undisturbed to provide more data overall as well as more consistent data.

The data pod release system includes a base frame with a mooring weight, a central column with one or more central pod attachments and an electronic pod, one or more data pod attachments, and one or more electrical connections. The electronic pod encases a master electronic underwater housing unit with master electronics to control the data pod release system (e.g., sensors, storage devices, microbial fuel cell system, etc). The one or more data pod attachments attach one or more data pods to the base frame and include electrical connections from master electronics to each data pod attachment. The data pod release system also includes one or more data pods, one or more underwater housing units, and one or more electronic storage devices. The one or more data pods are attached to the central column via the data pod attachment. Each underwater housing unit is encased in the data pod and connected to the master electronics via the electrical connections. Each electronic storage device is enclosed within the underwater housing unit and connected to the master electronics via the electrical connections to provide power and data to each electronic storage device.

Figure 1:
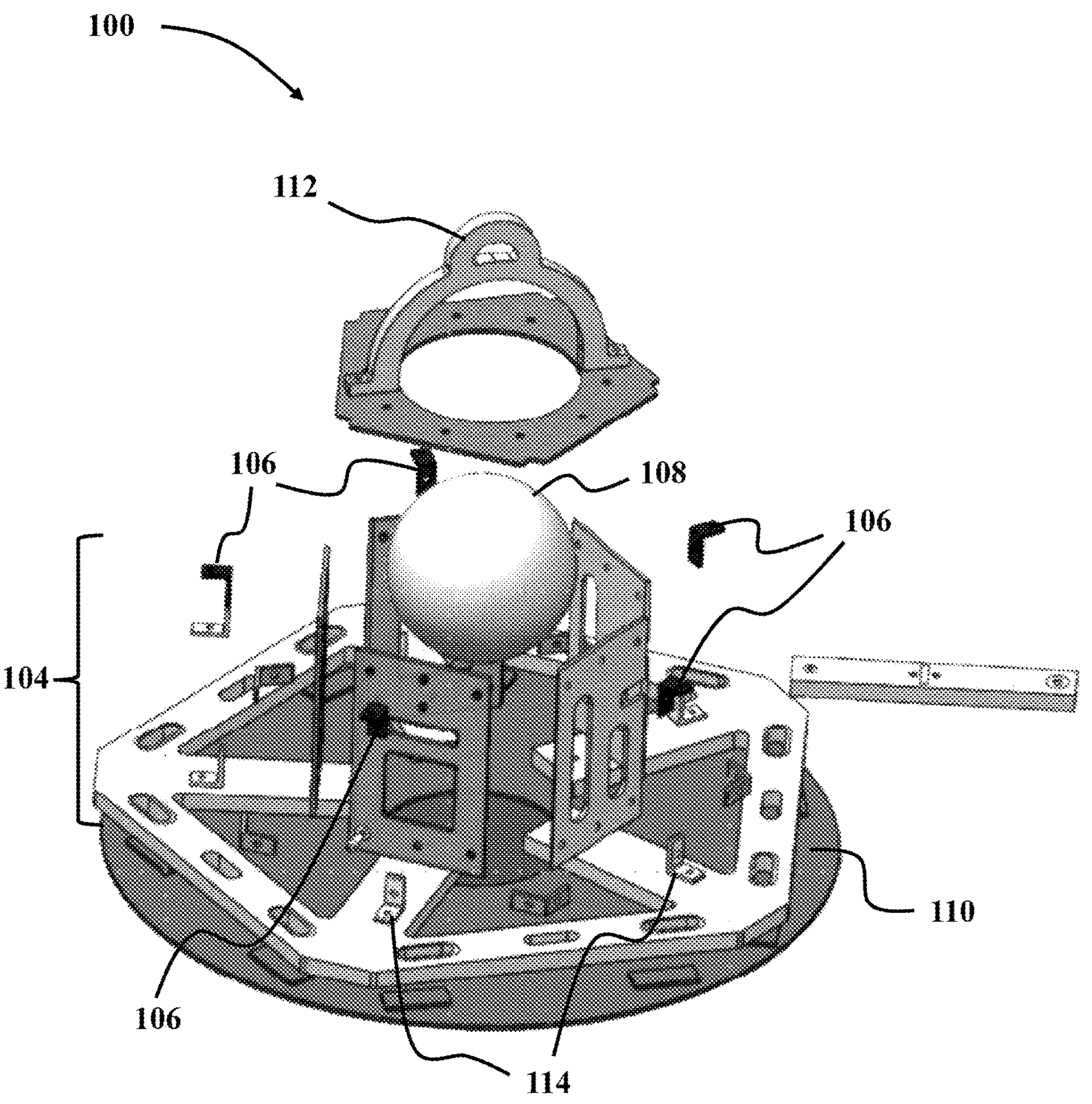
FIG. 1 is an exploded view of example of a data pod release system with a central column and without the data pod attachments.
Figure 2:
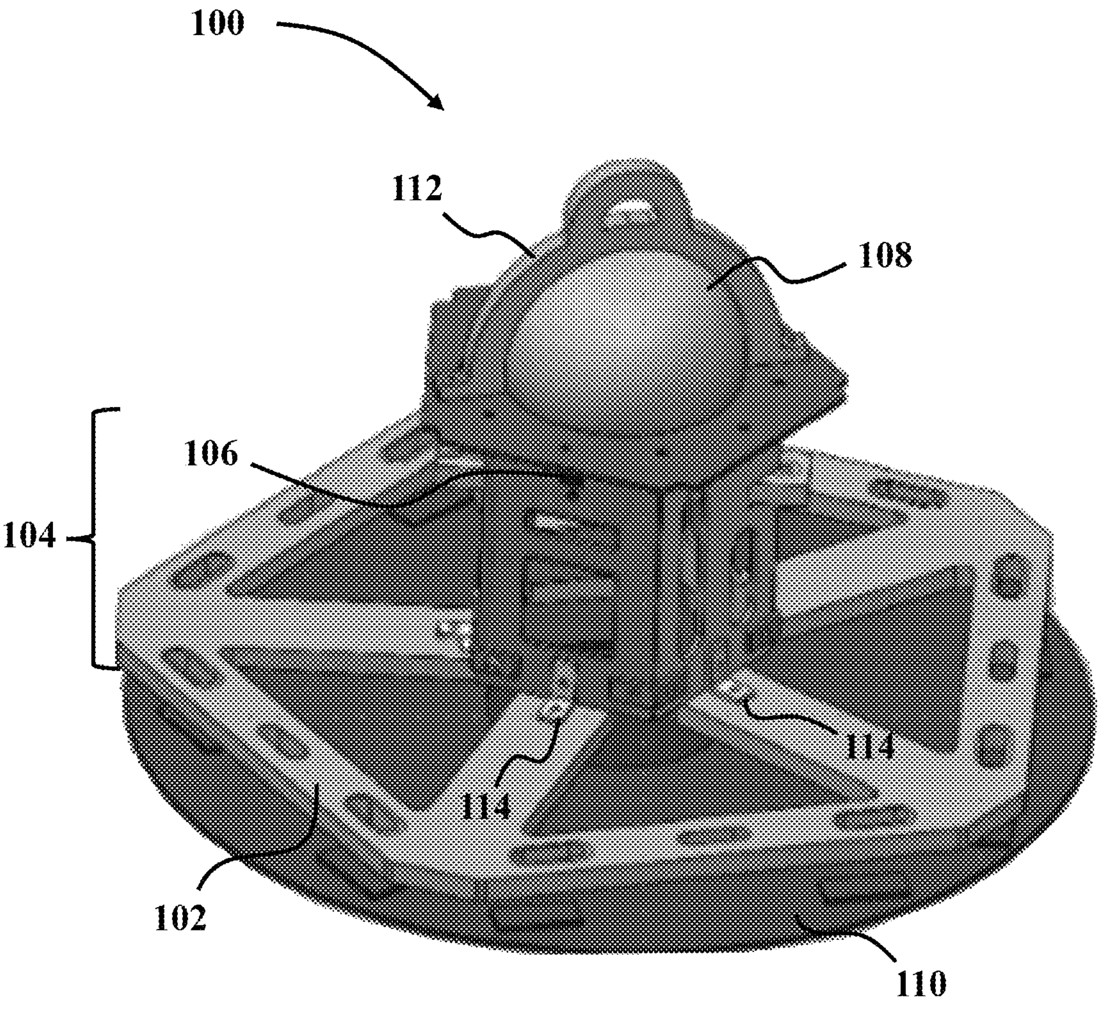
FIG. 2 is a perspective view of example of a data pod release system with a central column and without the data pod attachments.

In FIG. 1 through FIG. 7, any hatching patterning or shading is for illustrative purposes only to aid in viewing and should not be construed as being limiting or directed to a particular material or materials. Referring now to FIG. 1 and FIG. 2, a data pod release system without data pod attachments 100 are shown. FIG. 1 shows an exploded view of the data pod release system with the central column 104 and without data pod attachments 100. FIG. 2 shows a perspective view of the data pod release system with the central column 104 and without data pod attachments 100. The data pod release system 100 includes a base frame 102 with a mooring weight (not shown in FIG. 1), a central column 104, and one or more data pod attachments 300. In some examples, the base frame 102 may be neutrally buoyant. The base frame 102 also has data pod attachments 114 that allow the data pods 300 to be secured to the base frame 102 via a release mechanism (discussed in FIG. 7). The base frame 102 includes a central column 104. The central column 104 includes one or more central pod attachments 106, floating plates (not shown in FIG. 1), and an electronic pod (104+112). The electronic pod (104+112), in some examples, includes an electronic pod release mechanism (not shown in FIG. 1) and encases a master electronic underwater housing unit 108 with master electronics to control the data pod release system 100. The electronic pod (104+112) is secured to the base frame 102 with the central pod attachments 106. The electronic pod (104+112) may be the same material as the base frame 102. In some examples, the thickness of the electronic pod (104+112) is smaller than the base frame 102.

In the example shown in FIG. 1 and FIG. 2, the master electronic underwater housing unit 108 is the circular object encased in the electronic pod (104+112). The master electronic underwater housing unit 108 is the last underwater housing unit released to the surface. When an electronic pod release mechanism is used, the electronic pod (104+112) is released to the surface from the microbial fuel cell or other anchor system 110 with the base frame 102. The master electronic underwater housing unit 108 may be made of the same material as the data pods 402.

The electronic pod release mechanism may be passive (e.g., a galvanic release) or active, such as a release connected to the electronics to release the master electronic underwater housing unit 108 and base frame 102 from the microbial fuel cell or other anchor system 110. An example of an active release mechanism is an active galvanic release or a burn-type release that is controlled by the master electronics in the master electric underwater housing unit 108. The burn-type release may also be triggered by a sensor input or a signal from the master electronics or an acoustic signal from the surface that releases each data pod 402 or the master electric underwater housing unit 108 individually. Other examples of the release mechanism include passive release mechanisms, such as a timed-release mechanism or passive galvanic release. With electronic pod mechanism, the electronic pod (104+112) with the base frame 102 may be released after the data pods 300 are released.

In some examples, the master electronics located in the master electronics housing unit 108 may include a battery, one or more storage devices, sensors, energy harvesting or energy conversion electronics, and a means to control the data pod release system 100. For example, the master electronics can be a printed circuit board with a storage device and battery attached as well as a digital controller, such as a field programmable gate array, a microcontroller, a microprocessor, a computer, or a combination thereof to control specific mechanisms of the data pod release system 100, such as the release mechanism. In some examples, the master electronic underwater housing unit 108 may also include a satellite tracking module or a satellite communication module to assist in locating the master electronic underwater housing unit 108 on the surface of a water body. The master electronics would then be mounted within the master electronic underwater housing unit 108. The master electronics is also configured to be deployed in sleep mode. When the data pod release system 100 rests on the water body floor, the master electronics wakes and begins logging data. Sensors located in each data pod underwater housing unit 402 or in the master electronic underwater housing unit 108 would collect data. Any sensor may be used that can function on battery power or power generated from a microbial fuel cell 110 or other power source. The data would then be transferred to the master electronics via the one or more electrical connections (not depicted in FIG. 1) or transferred to each data pod underwater housing unit 402 via the one or more electrical connections depending on where the sensor or sensors are located.

The one or more electrical connections connect each underwater housing unit 402 with the master electronics within the master electronic underwater housing unit 108. Any type of electrical connection may be used. Each underwater housing unit 402 and the master electronics underwater housing unit 108 include a port located on the bottom of each housing unit. The port is connected to an easy-release underwater connector that is rigidly mounted to each data pod 300, with the matching mate easy-release underwater connector rigidly mounted to the base frame 102. The upward force of the data pod 300 upon release would separate the electrical connection between the underwater housing unit 402 and the master electronics housing unit 108.

The mooring weight (not depicted in FIG. 1) sits underneath the electronic pod (104+112) as seen in the exploded view of FIG. 1 in the circular outline. The mooring weight may be any type of weight. In an example, the mooring weight is barbell weights, sandbags, or a combination thereof. The buoyancy of the underwater housings 402 help the data pods 300 float to the surface when released. In the case of the electronic pod and base frame (102+104+112), the master electronic underwater housing 108 may not provide enough buoyancy to float the main unit so additional inflatable buoy bags or syntactic foam may be attached to the floating plates to increase the buoyancy of the electronic pod and base frame (102+104+112). In some additional examples, the central column 104 includes a recovery handle 112 at the top for deployment and recovery of the data pod release system.

In some examples, the data pod release system 100 may also include a microbial fuel cell or other anchor system 110 attached to the base frame 102. The exact dimensions and materials of the microbial fuel cell or other anchor system 110 can be modified to fit operational needs. The examples shown in FIG. 1 through FIG. 7 include a microbial fuel cell with a base frame 102 in the shape of a circle. The circular bottom most component is microbial fuel cell anode, which is in contact with the sea floor to harvest energy from the anaerobic electrogenic bacterial in the underlying sediment for proper function of the microbial fuel cell 110. The weight and the base frame 102 sit on top of the microbial fuel cell anode. Any type of microbial fuel cell or anchor system 110 may be used depending on the application. However, when a microbial fuel cell 110 is used, the microbial fuel cell 110 generally includes an anode, cathode, and a means to harvest the power generated.

Figure 3:
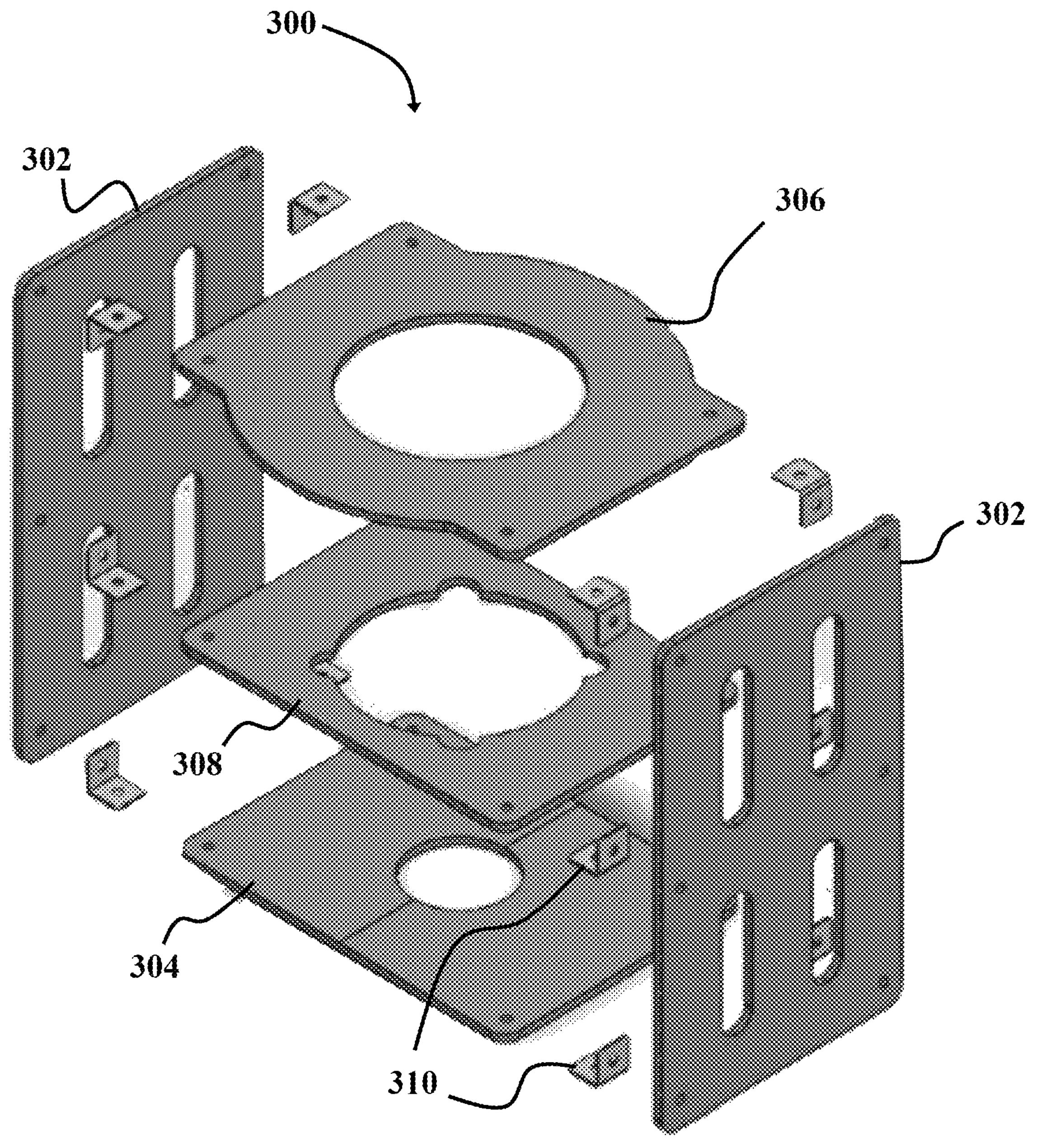
FIG. 3 is an exploded view of an example of a data pod without an underwater housing unit used in the data pod release system.
Figure 4:
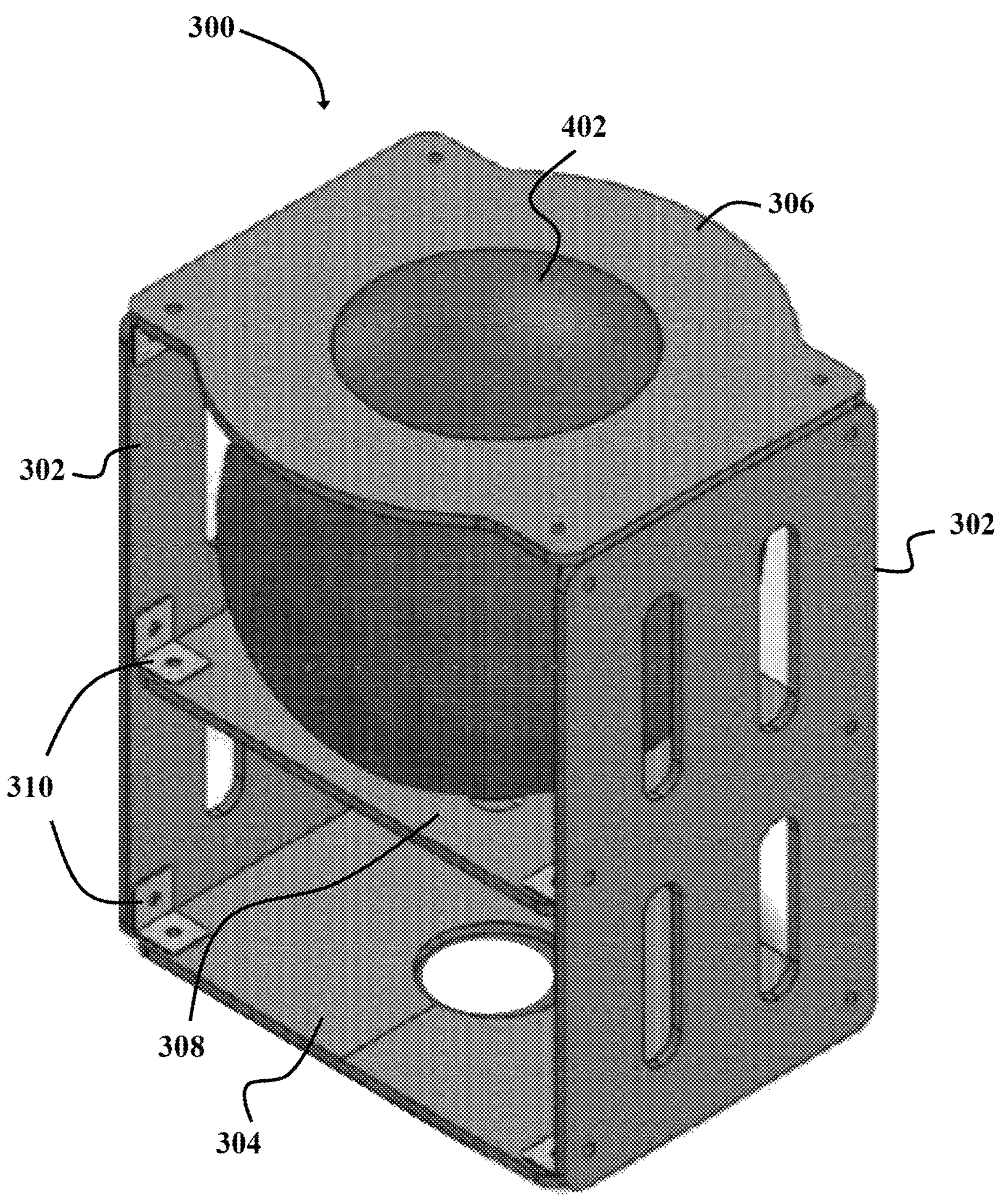
FIG. 4 is a perspective view of an example of a data pod with an underwater housing unit used in the data pod release system.
Figure 7:
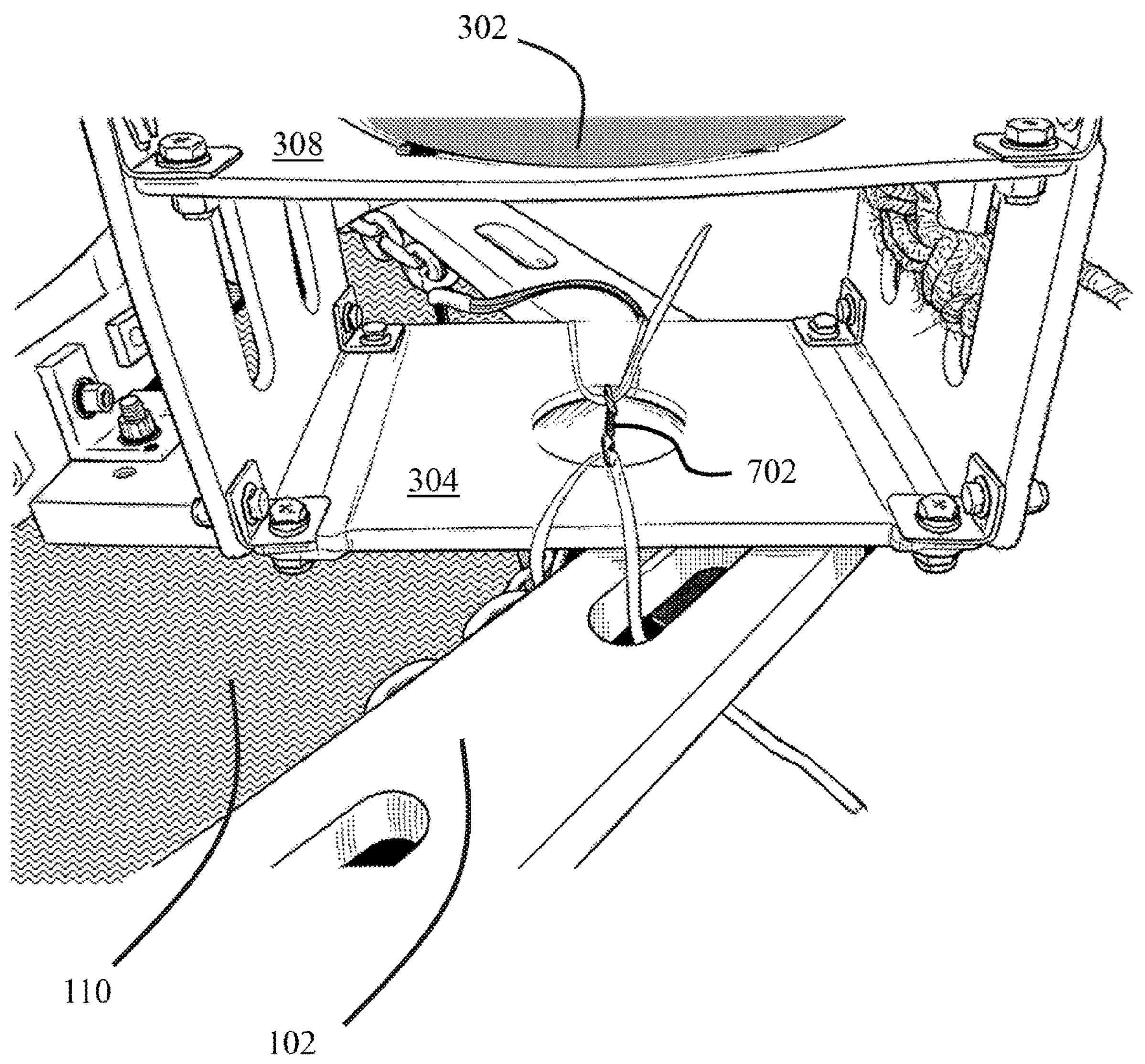
FIG. 7 is an image of an example of an electronic pod release mechanism or a data pod release mechanism for the data pod release system.

Referring now to FIG. 3 and FIG. 4, the one or more data pod attachments 114 secure one or more data pods 300 to the base frame 102. The data pods 300 include side walls 302, a lower plate 304, an underwater housing top plate 306, an underwater housing bottom plate 308, and brackets 310 that attach the side walls 302 and plates 304, 306, 308 together. The underwater housing top plate 306 and underwater housing bottom plate 308 secure the underwater housing unit 402 within the data pod 300. Each data pod 300 is attached to at least one data pod attachment 114 via the lower plate 304 of the data pod 300 to secure the data pod 300 to the base frame 102 of the data pod release system 100. The data pod attachments 114 secure the data pods 300 to the base frame 102 via the data pod release mechanism (an example is shown in FIG. 7). The data pod release mechanism may be the same as the electronic pod release mechanism previously described herein. When the data pod release mechanism is triggered, the data pods 300 become detached from the base frame 102 and float to the surface of the water body that the data pod release system 100 is being used in. In some examples, the data pod attachments 114 may be the same or different than the electronic pod (104+112). Any type of data pod attachments 114 can be used. Some examples include screws, bolts, plastic ties, rope, or combinations thereof. Additionally, the data pods 300 may be released individual or simultaneously depending on the application.

Referring to FIG. 4, the data pod release system 100 includes one or more underwater housing units 402 where each data pod 300 encloses an underwater housing unit 402. The underwater housing units 402 are connected to the master electronics in the master electronic underwater housing unit 108 via the one or more electrical connections previously disclosed herein. As previously stated herein, each underwater housing unit 402 may include individual electronic storage devices and sensors depending on the design and application. The electronic storage devices and sensors would be the same electronic storage devices as sensors previously disclosed herein. In some examples, the underwater housing unit 402 also includes a satellite tracking module or a satellite communication module to assist in locating the underwater housing unit 402 on the surface of a water body.

Figure 5:
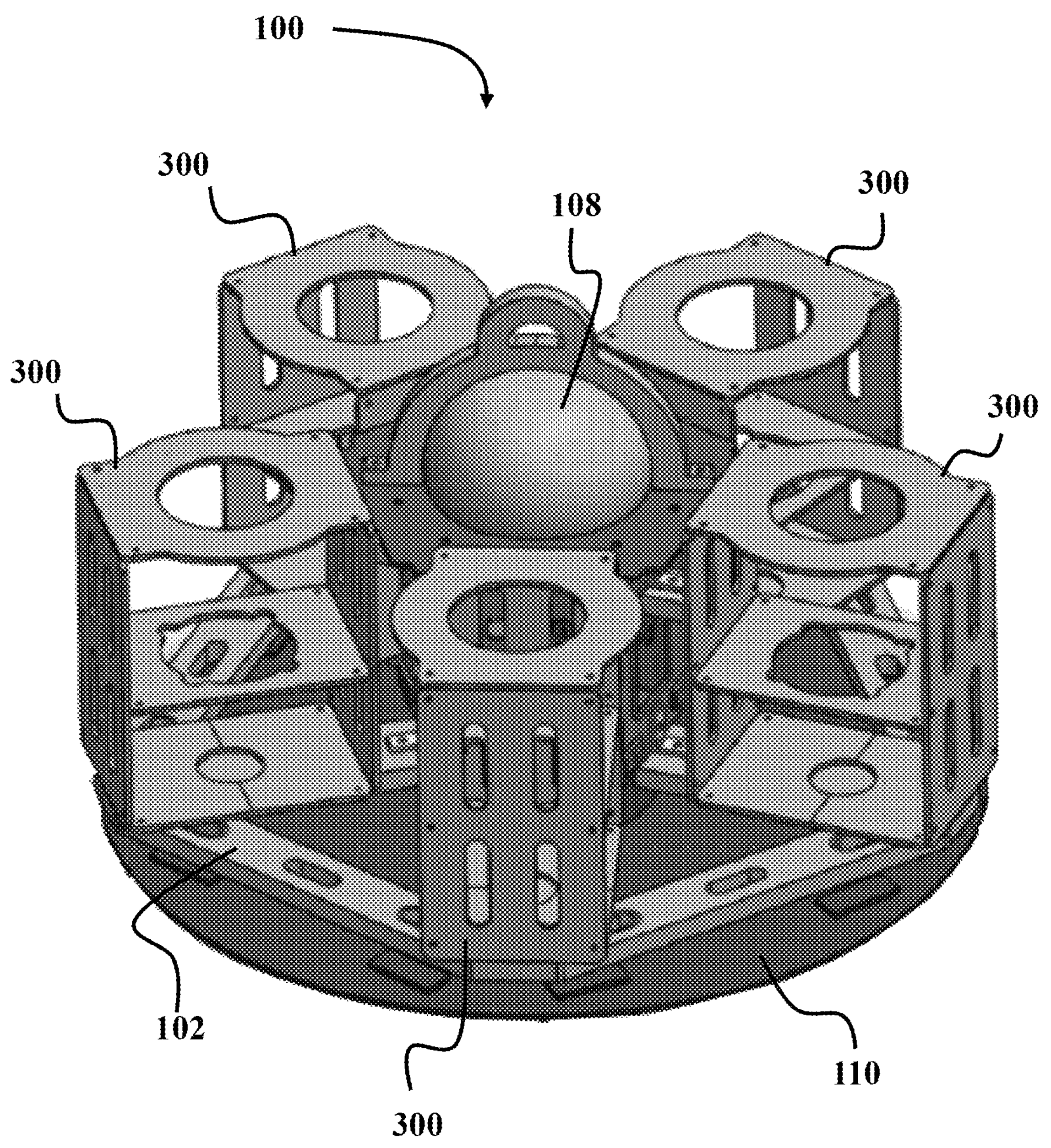
FIG. 5 is a perspective view of the data pod release system with the base frame including a master electronic underwater housing unit and five data pods without underwater housing units.
Figure 6:
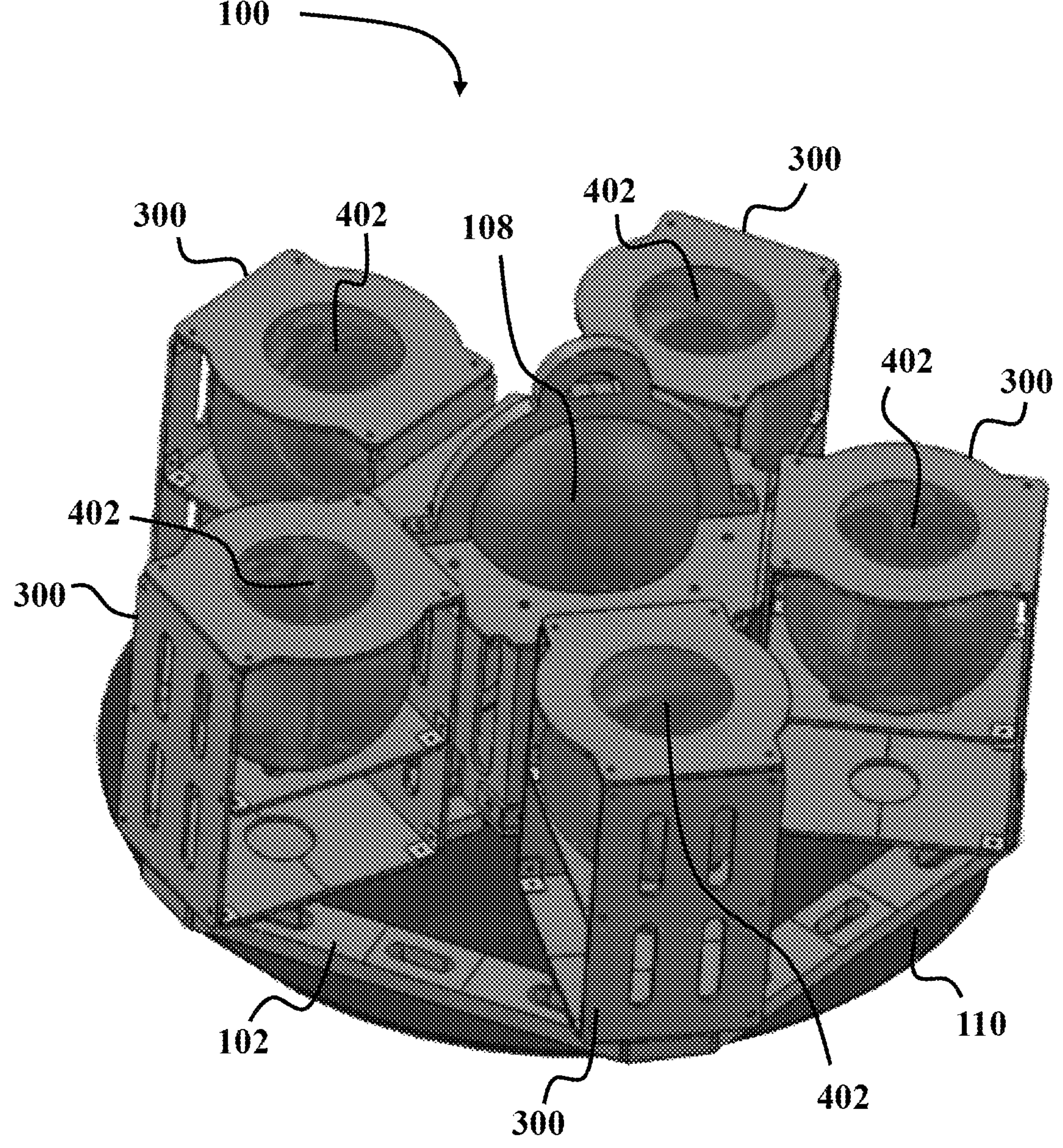
FIG. 6 is a perspective view of the data pod release system with the base frame including a master electronic underwater housing unit and five data pods with underwater housing units.

Referring now to FIG. 5, a perspective view of an example of a data release system 100 with five empty data pods attached is shown. In FIG. 6, a perspective view of an example of a fully assembled data pod release system 100 with five data pods 300 attached including the underwater housing units 402. In FIG. 5 and FIG. 6, the same data pods 300, base frame 102, microbial fuel cell or other anchor system 110, and master electronic underwater housing unit 108 as previously described herein are shown.

Referring now to FIG. 7, an example of a release mechanism for the data pod 300 or the electronic pod (104+112) and base frame 102 is shown. The data pod or electronic pod release mechanism 702 is the same release mechanism 702 previously disclosed herein for the electronic pod release mechanism and data pod release mechanism. In the example shown in FIG. 7, a passive galvanic release mechanism is shown.

A data pod release device may also be used herein. The data pod release device has the same base frame 102, mooring weight, central column 104, one or more data pod attachments 106, one or more electrical connections, one or more data pods 300, one or more underwater housing units 402, one or more electronic storage devices, and one or more sensors as previously described herein for the data pod release system 100. Additionally, the central column 104 may include the same floating plates, electronic pod (104+112) and electronic pod release mechanism as previously described herein. Similarly, the data pod release mechanism may be the same as previously described herein.

As used herein, the term "about" is used to provide flexibility to a numerical range endpoint by providing that a given value may be "a little above" or "a little below" the endpoint. The degree of flexibility of this term can be dictated by the particular variable and would be within the knowledge of those skilled in the art to determine based on experience and the associated description herein.

As used herein, a plurality of items, structural elements, compositional elements, and/or materials may be presented in a common list for convenience. However, these lists should be construed as though each member of the list is individually identified as a separate and unique member. Thus, no individual member of a list should be construed as a de facto equivalent of any other member of the same list merely based on their presentation in a common group without indications to the contrary.

Unless otherwise stated, any feature described herein can be combined with any aspect or any other feature described herein.

Reference throughout the specification to "one example", "another example", "an example", means that a particular element (e.g., feature, structure, and/or characteristic) described in connection with the example is included in at least one example described herein, and may or may not be present in other examples. In addition, the described elements for any example may be combined in any suitable manner in the various examples unless the context clearly dictates otherwise.

The ranges provided herein include the stated range and any value or sub-range within the stated range. For example, a range from about 0.1 to about 20 should be interpreted to include not only the explicitly recited limits of from about 0.1 to about 20, but also to include individual values, such as 3, 7, 13.5, etc., and sub-ranges, such as from about 5 to about 15, etc.

In describing and claiming the examples disclosed herein, the singular forms "a", "an", and "the" include plural referents unless the context clearly dictates otherwise.

What is claimed is:

1. A data pod release system for long-term underwater data collection, comprising:

a base frame, wherein the base frame includes:

a mooring weight configured to maintain the base frame on a water body floor;

a central column with one or more central pod attachments, floating plates, and an electronic pod with an electronic pod release mechanism, wherein the electronic pod encases a master electronic underwater housing unit, wherein the master electronic underwater housing unit contains master electronics configured to collect data from one or more sensors, store cumulative collected data, and control sequential release of one or more data pods;

one or more data pod attachments configured to releasably attach the one or more data pods to the base frame via respective data pod release mechanisms;

one or more electrical connections configured to connect each underwater housing unit with the master electronics within the master electronic underwater housing unit;

the one or more data pods attached to the base frame via the one or more data pod attachments, wherein each data pod of the one or more data pods includes a respective data pod release mechanism configured to release the data pod from the base frame, and a buoyancy element configured to cause the data pod to surface upon release;

one or more underwater housing units, wherein each underwater housing unit of the one or more underwater housing units is encased in a respective data pod of the one or more data pods and connected to the master electronics via the one or more electrical connections;

one or more electronic storage devices, wherein each electronic storage device of the one or more electronic storage devices is located within a respective underwater housing unit, connected to the master electronics via the electrical connections, and configured to store cumulative data collected by the data pod release system;

the one or more sensors configured to collect data and transfer the data to at least one of the master electronics, each underwater housing unit, or a combination thereof;

wherein the data pod release system is configured to operate such that upon release of a data pod from the base frame, the released data pod surfaces to a water body surface while the base frame with the master electronic underwater housing unit and any unreleased data pods remain deployed on the water body floor, wherein the electronic storage device in each released data pod contains cumulative data collected by the data pod release system from deployment up to a time of release of that data pod, and wherein the master electronics continues to collect data and control release of remaining data pods after release of each data pod.

2. The data pod release system of claim 1, further including a microbial fuel cell attached to the base frame, wherein the microbial fuel cell is configured to provide continuous power to the master electronics to enable long-term deployment of the data pod release system.

3. The data pod release system of claim 1, wherein the base frame is a neutrally buoyant material.

4. The data pod release system of claim 2, wherein the microbial fuel cell includes an anode, a cathode, and circuitry configured to harvest power that the microbial fuel cell generates.

5. The data pod release system of claim 1, wherein the master electronic underwater housing unit is made of the same material as the one or more data pods.

6. The data pod release system of claim 1, wherein the electronic pod release mechanism or the data pod release mechanism is a passive release mechanism, an active release mechanism, or a combination thereof.

7. The data pod release system of claim 6, wherein the active release mechanism is selected from an electrically-activated burn wire release mechanism triggered by at least one of a sensor input, a signal from the master electronics, or an acoustic signal from the water body surface.

8. The data pod release system of claim 6, wherein the passive release mechanism is a passive galvanic release mechanism or a timed-release mechanism.

9. The data pod release system of claim 1, wherein the floating plates include buoy bags, syntactic foam, or a combination thereof.

10. The data pod release system of claim 1, wherein the master electronics include a battery, one or more storage devices, sensors, energy harvesting or energy conversion electronics, and a digital controller configured to control the data pod release system.

11. The data pod release system of claim 10, wherein the digital controller is configured to control sequential release of the one or more data pods based on at least one of: a predetermined time schedule, a sensor input, or a signal from the water body surface.

12. The data pod release system of claim 1, wherein the master electronics is configured to deploy in sleep mode and wake when the data pod release system rests on the water body floor.

13. The data pod release system of claim 1, wherein each underwater housing unit includes a port that is an easy-release underwater connector rigidly mounted to the respective data pod, with a matching mate easy-release underwater connector mounted to the base frame, wherein the port is configured to disconnect upon release of the data pod from the base frame.

14. The data pod release system of claim 1, wherein each data pod and the respective electronics include at least one of a satellite tracking module or a satellite communication module configured to facilitate location of the data pod or electronic pod after surfacing.

* * * * *